United States Patent

Kanevsky et al.

Patent Number: 6,167,352
Date of Patent: Dec. 26, 2000

[54] MODEL-BASED DIAGNOSTIC SYSTEM WITH AUTOMATED PROCEDURES FOR NEXT TEST SELECTION

[75] Inventors: Valery Kanevsky, Los Gatos; Lee A. Barford, San Jose, both of Calif.

[73] Assignee: Agilent Technologies, Inc., Palo Alto, Calif.

[21] Appl. No.: 08/882,791

[22] Filed: Jun. 26, 1997

[51] Int. Cl.[7] .................................................. G01R 31/00
[52] U.S. Cl. ........................................ 702/81; 395/183.09
[58] Field of Search ........................... 702/81; 395/183.09

[56] References Cited

U.S. PATENT DOCUMENTS 5,195,095  3/1993  Shah ........................................ 371/15.1
5,561,762  10/1996  Smith et al. ........................ 395/183.09

*Primary Examiner*—Thomas R. Peeso

[57] ABSTRACT

A model-based diagnostic system that enables selection of components for replacement and selection of the next test to apply to a device under test based on economic costs associated with replacing components and conducting tests.

25 Claims, 6 Drawing Sheets

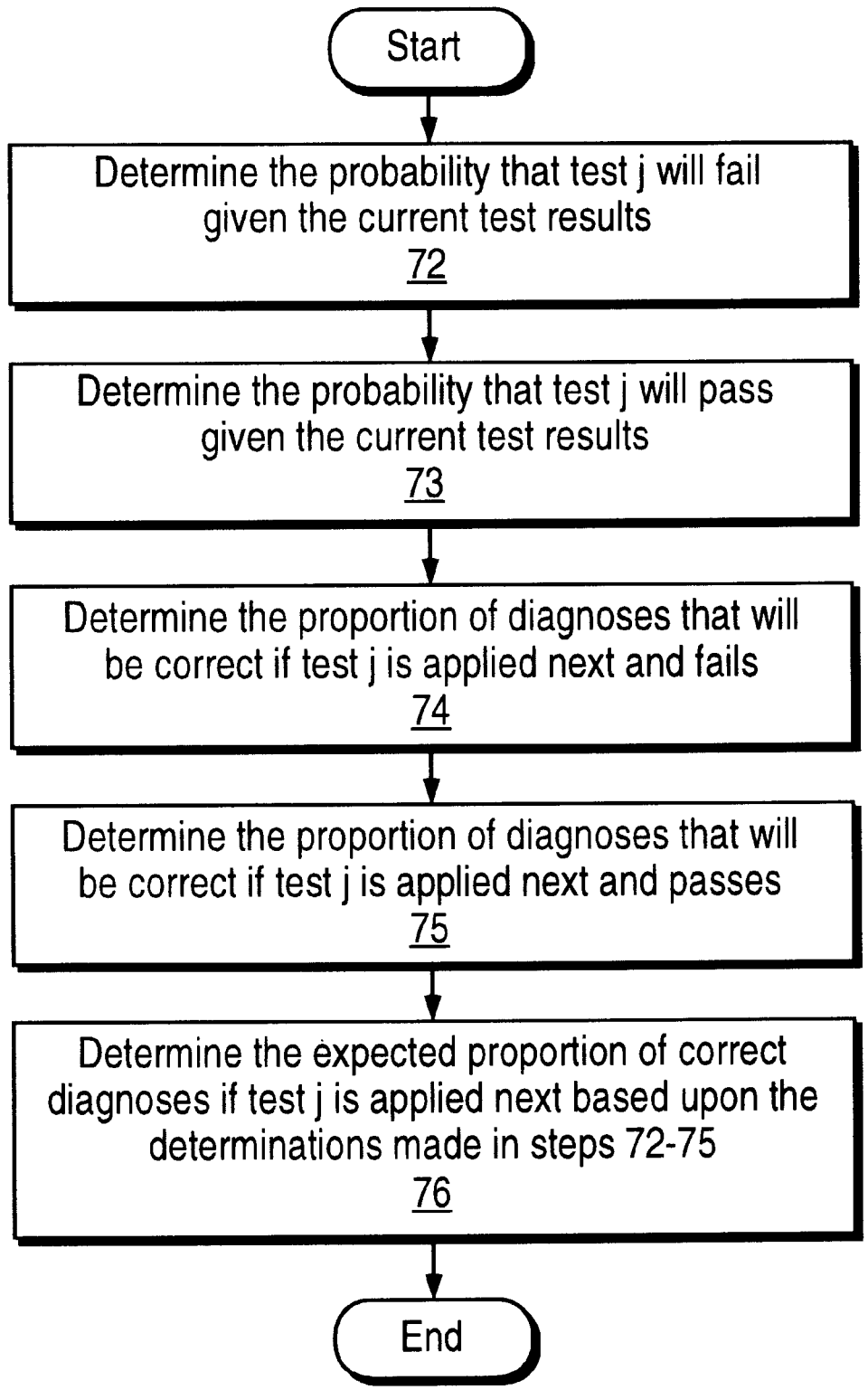

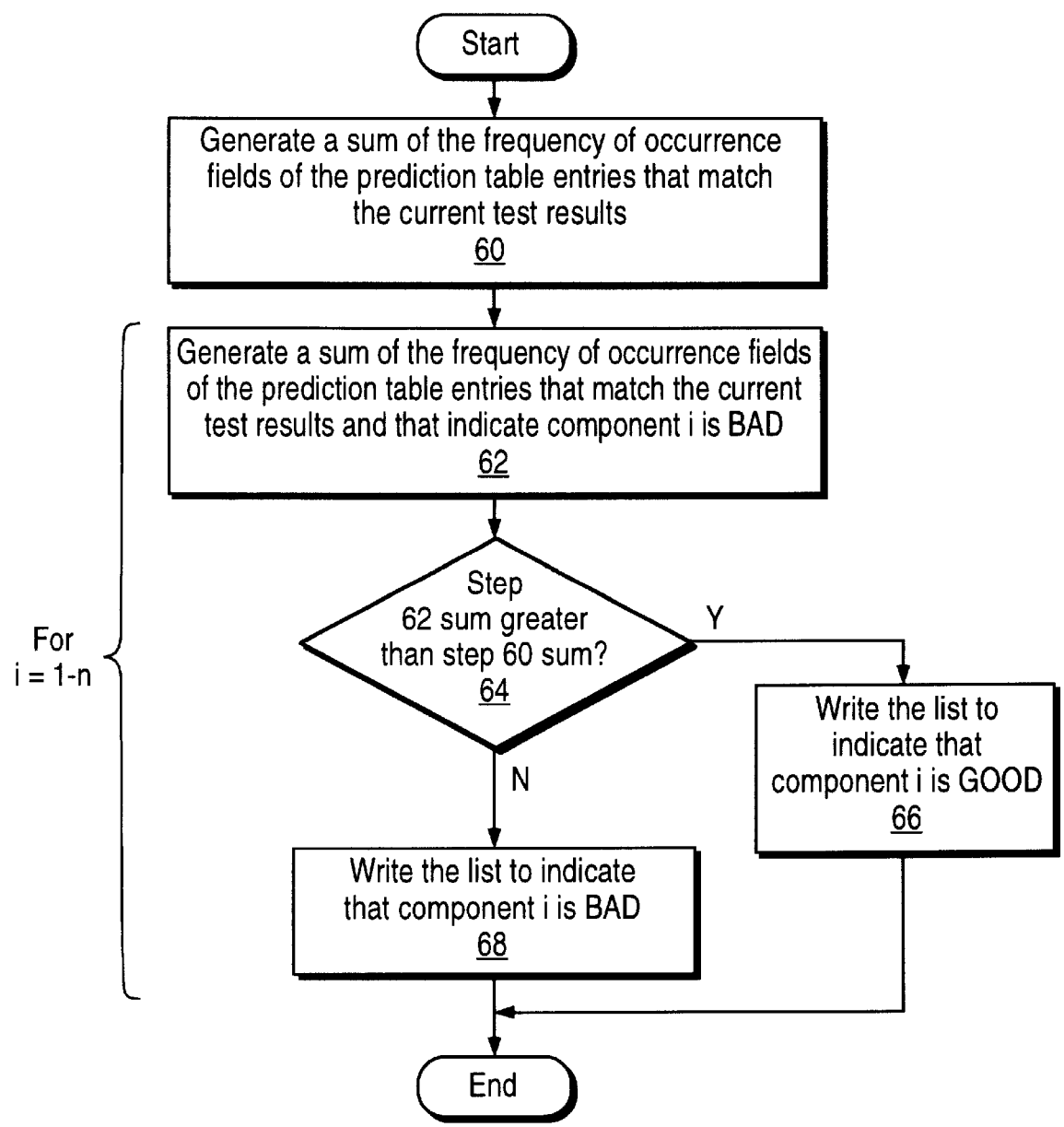

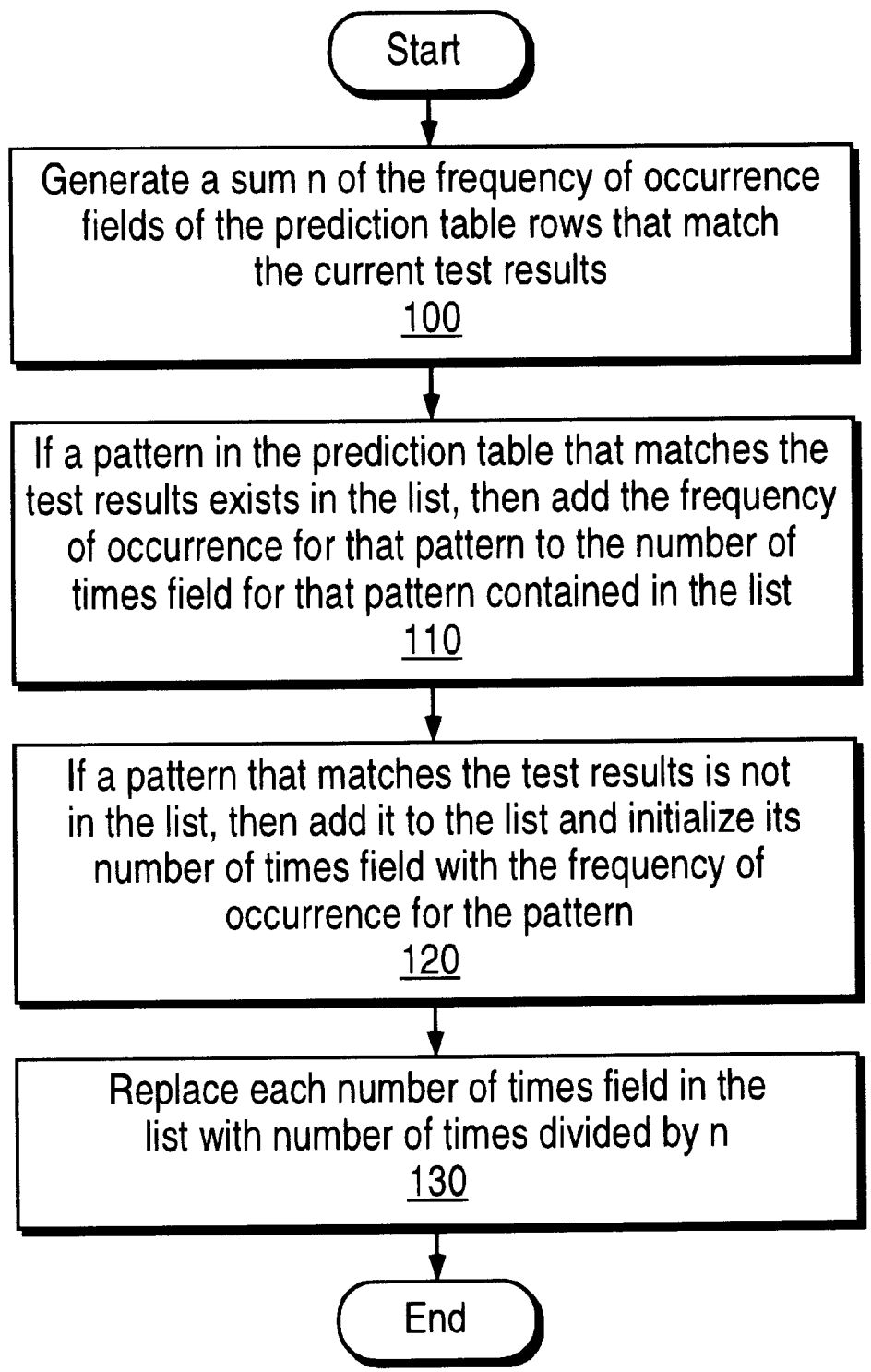

MODEL-BASED DIAGNOSTIC SYSTEM WITH AUTOMATED PROCEDURES FOR NEXT TEST SELECTION

BACKGROUND OF THE INVENTION

1. Field of Invention

The present invention pertains to the field of device testing. More particularly, this invention relates to a model-based diagnostic system that provides automated tools for selection of one or more next tests to apply to a device under test.

2. Art Background

A wide variety of systems including mechanical, electrical and chemical systems as well a combinations thereof are commonly tested under a variety of environments including manufacturing test environments and field support environments. These systems include electronic systems such as circuit boards and full systems having a variety of circuit boards. These systems also include automobiles, satellite systems, and test equipment. Such a system while undergoing a test cycle may be referred to as a device under test (DUT).

Such a DUT typically includes a variety of components. Such components include, for example, integrated circuit devices, electrical components, battery systems, mechanical components, electrical buses, wiring components, and wiring harness and backplane components. Any one or more of such components may fail and cause a failure of the DUT.

Prior diagnostic systems for determining likely failed components in a DUT include model-based diagnostic systems. A model-based diagnostic system may be defined as a diagnostic system that renders conclusions about the state of the DUT using actual DUT responses from applied tests as an input to the diagnostic system. Such a diagnostic system is usually based upon computer generated models of the DUT and its components and the diagnostic process.

It is usually desirable to employ a model-based diagnostic system that is based upon a more manageable model of DUT characteristics. Such a model-based diagnostic system usually minimizes the amount of modeling information for a DUT that must be generated by a user before the system can be applied to the DUT. Such modeling usually speeds the process of adapting the diagnostic system to differing DUTs and increases confidence in the determinations rendered by the diagnostic system.

U.S. patent application Ser. No. 08/551,054 of Preist et. al. discloses a model-based diagnostic system, based on functional tests, in which the modeling burden is greatly reduced. The model disclosed in Preist et. al. employs a list of functional tests, a list of components exercised by each functional test along with the degree to which each component is exercised by each functional test, and (if available) the historical or a priori failure rate for individual components. Such model data may be rapidly and easily determined or estimated by test engineers, test programmers or others familiar with, but not necessarily expert on, the device under test. Typically, the models may be developed by test engineers in a few days to a few weeks depending on the complexity of the device under test.

The model-based diagnostic system of Preist et. al. is well-suited for a test environment that allows the automatic application of a sequence of tests to a device under test. Such a diagnostic system is particularly applicable when all available tests can be applied without a significant increase in time and cost. This situation is common in electronics manufacturing. For example, a printed circuit board can be attached to a fixture and a large number of tests can be applied before the device is removed from the fixture.

Other test environments, however, may be subject to time and/or cost constraints. For example, the application of diagnostic tests to an automobile or electronic device after sale is typically subject to time and cost constraints. Typically, only a few of the available tests can be performed economically in such a post-sale test environment. In such test environments, it is highly desirable to minimize the time required to diagnose a failure and to replace failed components. Therefore, it is highly desirable to be able to determine a next test to apply to a DUT based upon the results of earlier tests. The next test should be the best test from the point of view of eventually acheiving a correct diagnosis.

Prior model-based diagnostic systems which employ more manageable models usually do not provide automated tools for selecting a best next test. As a consequence, prior model-based diagnostic systems may impose excessive and expensive down time of the DUT during application of tests that are not necessarily the best next test to apply. Moreover, such prior systems usually do not provide tools for taking into account the economic costs associated with performing particular tests or replacing particular components of the device under test.

SUMMARY OF THE INVENTION

A model-based diagnostic system is disclosed which provides automated tools that enable a selection of one or more next tests to apply to a device under test from among the tests not yet applied based upon a manageable model of the device under test. In addition, the diagnostic system enables selection of components for replacement in response to indications of the costs associated with replacing components. The diagnostic system also enables selection of a next test to apply to the device under test in response to indications of the economic consequences of applying the tests.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which:

FIG. 4 illustrates a procedure for selecting the best next test to apply to the device under test;

FIG. 5 illustrates a procedure for determining the most likely bad component of the device under test;

FIG. 6 illustrates an alternative embodiment of the procedure for determining the most likely bad component of the device under test which determines the probabilities of failure of the sets of components.

DETAILED DESCRIPTION

Figure 1:
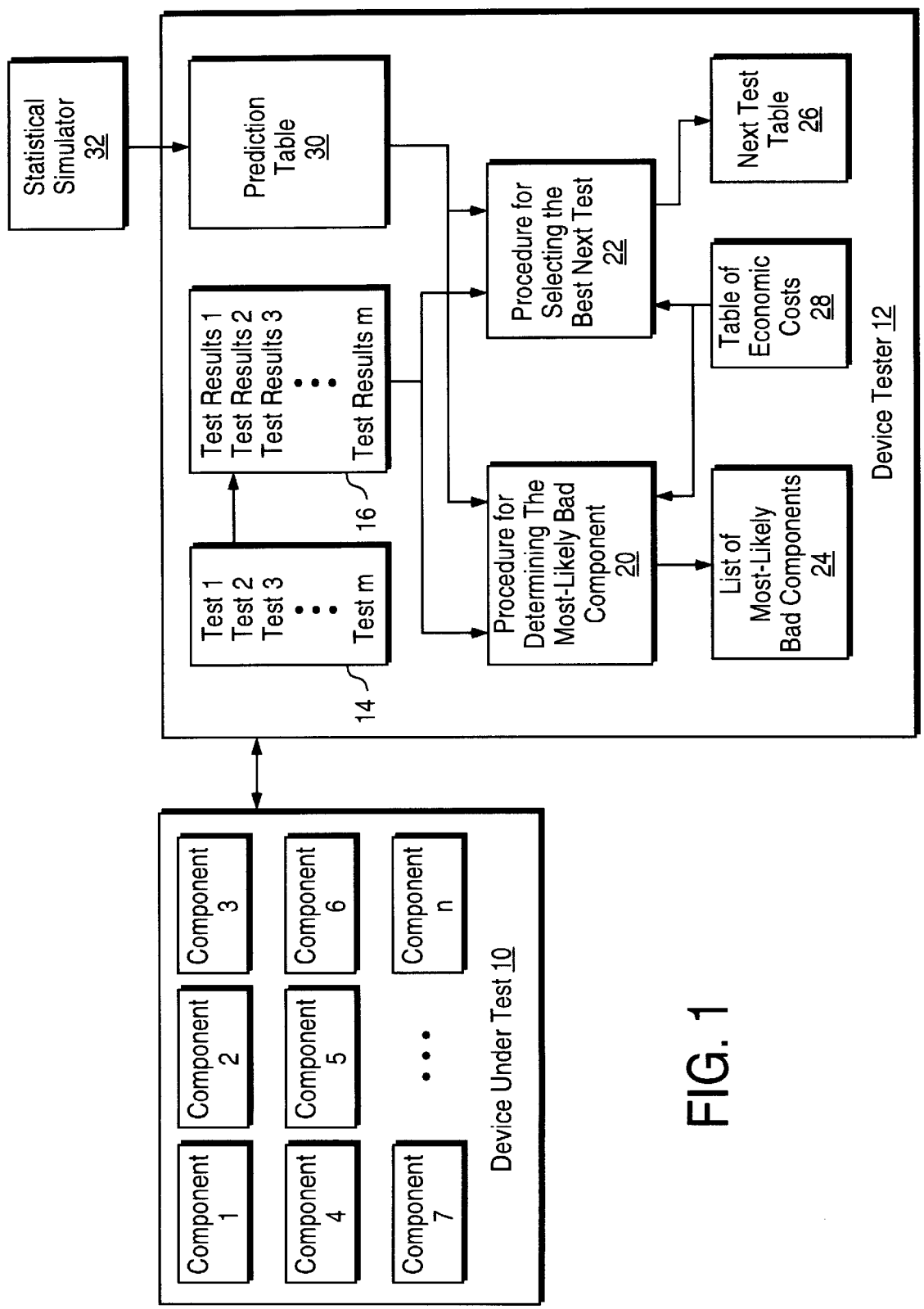
FIG. 1 illustrates a device under test coupled to a device tester which provides automated best next test selection using manageable model-based diagnosis.

FIG. 1 illustrates a device under test 10 coupled to a device tester 12 which provides automated best next test selection using manageable model-based diagnosis. The device under test 10 includes a set of components 1–n. The device tester 12 implements a set of diagnostic tests 14 (test 1–m) the results of which when applied to the device under test 10 are stored in a test result table 16 (test results 1–m). At any time during a test cycle on the device under test 10, the test result table 16 indicates which of the tests 1–n have been applied and whether each applied test passed or failed.

The tester 12 implements a procedure 22 for selecting one or more best next tests from among the tests 1–m not yet applied to the device under test 10. The procedure 22 bases the best next test determinations upon a current state of the test result table 16 and the contents of a prediction table 30. The procedure 22 generates a next test table 26 that indicates which ones of the tests 1–m not yet applied to the device under test 10 are best next tests to be applied. The procedure 22 also enables selection of one or more best next tests using economic costs listed in a table 28 which are associated with performing each of the tests 1–m. The economic costs in the table 28 reflect the costs incurred by the system downtime required to run the tests 1–m and the costs of parts and labor needed to perform the necessary repairs.

The tester 12 includes a procedure 20 which enables a user to determine the most-likely bad component from among the components 1–n. The procedure 20 acts upon a current state of the test result table 16 and the contents of the prediction table 30. The procedure 20 generates a list 24 of the most likely bad components from among the components 1–n. The procedure 20 also enables selection of one or more of the components 1–n for replacement using economic costs associated with replacing each of the components 1–n. The economic costs of replacing components 1–n are stored in a table of economic costs 28. The economic costs in the table 28 reflect component costs and the costs incurred as a result of downtime of the device under test 10 while components are replaced.

The device under test 10 represents a variety of systems including mechanical, electrical and chemical systems as well a combinations thereof including circuit boards, full systems having a variety of circuit boards, automobiles, satellite systems, and test equipment. The device tester 12 includes the test mechanisms necessary for imparting a stimulus or multiple stimuli onto the device under test 10 and measuring a response to the stimulus. Such test mechanisms include electrical circuitry for generating electrical signals and measuring response electrical signals as well as mechanisms for generating mechanical or chemical stimulus and for measuring mechanical or chemical response depending upon the nature and function of the device under test 10. A stimulus imparted onto the device under test 10 may be electrical, mechanical, chemical, or a combination thereof, and the response for any of the imparted stimuli may be electrical, mechanical, chemical, or a combination thereof.

The tester 12 also includes a computer or equivalent mechanism for performing the procedures 20 and 22. The tester 12 includes a mechanism such as a graphical display for presenting to a user the results of automated best next test and most likely bad component determinations. The tester 12 may also transmit data indicating the next test to an element that operates in response to such data. The element could include another computer program, or could be an automated device such as an automated repair cell, for example. The procedures 20 and 22 may be embodied in application software for any one of a wide variety of available computer system platforms or may be embodied as diagnostic code that executes on a hardware computing platform designed specifically for the device tester 12. The application software or diagnostic code as well as the contents of the prediction table 30 and the table of economic costs 28 may be embedded within a persistent store in the device tester 12 or may be downloaded into memory within the device tester 12 via a variety of suitable communication mechanisms. The components 1–n are each a separate well-defined replaceable component. Such replaceable components include, for example, integrated circuit devices, electrical components, battery systems, mechanical components, electrical buses, wiring components, and wiring harness and backplane components. Any one or more of such components may fail and cause a failure of the device under test 10.

For the purposes of the techniques disclosed herein, each of the components 1–n is either in a good state (GOOD) or a bad state (BAD). It is assumed that the components 1–n do not transition between the good and bad states during the course of a test cycle, i.e., intermittent failures of the components 1–n are not handled by the techniques disclosed herein.

Each of the tests 1–m acts on a subset of one or more of the components 1–n. The subsets of components acted upon or covered by a particular test 1–m may overlap with subsets covered by other of the tests 1–m. If a particular test 1–m fails, it is assumed that at least one of the components 1–n covered by that particular test is bad. Each test 1–m either passes or fails when applied to the device under test 10. If a particular test of the tests 1–m generates a finite number of test results then that particular test is treated as a number of tests, each with only two possible results, pass or fail.

Each test result 1–m includes an indication of whether the corresponding test 1–m passed (PASS) or failed (FAIL) and an indication of whether the corresponding test 1–m has been applied to the device under test 10 during a current test cycle. The subset of the tests 1–m that have been applied to the device under test 10 at a particular point in a test cycle are referred to as applied tests. The results of the applied tests are indicated in the current state of the test result table 16.

The prediction table 30 contains the numbers of occurrences of the test results for any probable test results and probable bad components jointly. In one embodiment, the prediction table 30 contains simulated experimental data generated by a statistical simulator 32. The statistical simulator 32 may be implemented on a separate computer system or may be implemented within the device tester 12. The use of a statistical or a Monte Carlo approach to produce the simulated experimental data in the prediction table 30 eliminates the need to produce real experimental data that would otherwise require years of collecting test results from real test systems and real world situations.

In an alternative embodiment, the prediction table 30 contains actual experimental data reflecting actual prior test results and component failures from historical records. In other embodiments, the prediction table 30 data may be based on a failure mode affects analysis.

Hereinafter, the term "random number" is meant to include the output of pseudo-random number generators as well as numbers chosen through some truly stochastic physical process.

The input to the statistical simulator 32 is a model of the capability of each the tests 1–m in locating bad components among the components 1–n. The model input to the statistical simulator 32 is given by the number of the component 1–n, the number of tests 1–m, and shared or joint coverages of the tests 1–m on the components 1–n, and for each component i, its statistical probability of failure, p(i). The coverage of test j on component i is referred to as cov(i,j). Each coverage cov(i,j) is a real number between 0 and 1, inclusive, and is a fraction of the functionality of component i that is checked by test j.

The joint coverages specify known dependencies among the tests 1–m. A joint coverage arises when two or more of the tests 1–m have some coverage that tests one of the components 1–n in the exactly the same way. An example of a joint coverage is when two or more of the tests 1–m performed by the device tester 12 use the same measurement subroutine with the same parameters.

A joint coverage k is specified by a list of the tests 1–m that use the joint coverage k and for each component i the amount of joint coverage k has on i. The amount of joint coverage k has on i is denoted as jcv(i,k) and is a number between 0 and 1 inclusive.

The prediction table 30 contains a set of entries each having a field for a frequency-of-occurrence value, a field for a test result pattern, and a field for a component state pattern. In one embodiment, each frequency-of-occurrence value indicates the number of times the corresponding patterns of component states and test results occurred during the course of the simulation performed by the statistical simulator 32. In an alternative embodiment, each frequency-of-occurrence value indicates the number of times the corresponding patterns of component states and test results actually occurred during the course of prior tests on similar systems. Each entry in the prediction table 30 corresponds to a unique pattern of test results and component states.

Table 1 shows example entries the prediction table 30 for an embodiment wherein n=3 and m=3.

TABLE 1

| Test Results | Component States | Frequency-of-Occurrence |
|---|---|---|
| 000 | 100 | 317 |
| 000 | 010 | 304 |
| 000 | 001 | 290 |
| 100 | 100 | 2664 |
| 100 | 110 | 3 |
| 100 | 101 | 1 |
| 100 | 001 | 33 |
| 110 | 100 | 336 |
| 110 | 110 | 24 |
| 110 | 011 | 1 |
| 111 | 110 | 3 |
| 111 | 101 | 3 |
| 111 | 011 | 1 |
| 101 | 101 | 18 |
| 101 | 011 | 1 |
| 101 | 001 | 300 |
| 010 | 100 | 40 |
| 010 | 110 | 5 |
| 010 | 010 | 2682 |
| 010 | 011 | 2 |
| 011 | 110 | 1 |
| 011 | 010 | 259 |
| 011 | 011 | 23 |
| 001 | 101 | 2 |
| 001 | 010 | 38 |
| 001 | 011 | 4 |
| 001 | 001 | 2645 |

The component state, GOOD or BAD, for each component 1–n is represented by a single bit (0 or 1). Patterns of test results are indicated by a string of bits that represent the PASSED or FAILED results of the tests 1–m. Each test result is represented by a single bit (0 or 1) for each of the tests 1–m.

The values in the frequency-of-occurrence field indicate the number of times the corresponding pair of component state and test result patterns occurred during the course of the simulation performed by the statistical simulator 32 or during actual prior test runs. For example, the test result pattern 000 paired with the component failure pattern 100 occurred 317 times, while the test result pattern 000 paired with the component failure pattern 010 occurred 304 times during the simulation or the prior tests.

Each pattern of component states and each pattern of test results appears separately in the prediction table 30 more than once. Each pair of component states and test results appear together in the table 30 at most once. As a consequence, the test result and component failure fields together provide the key of the prediction table 30.

Figure 2:
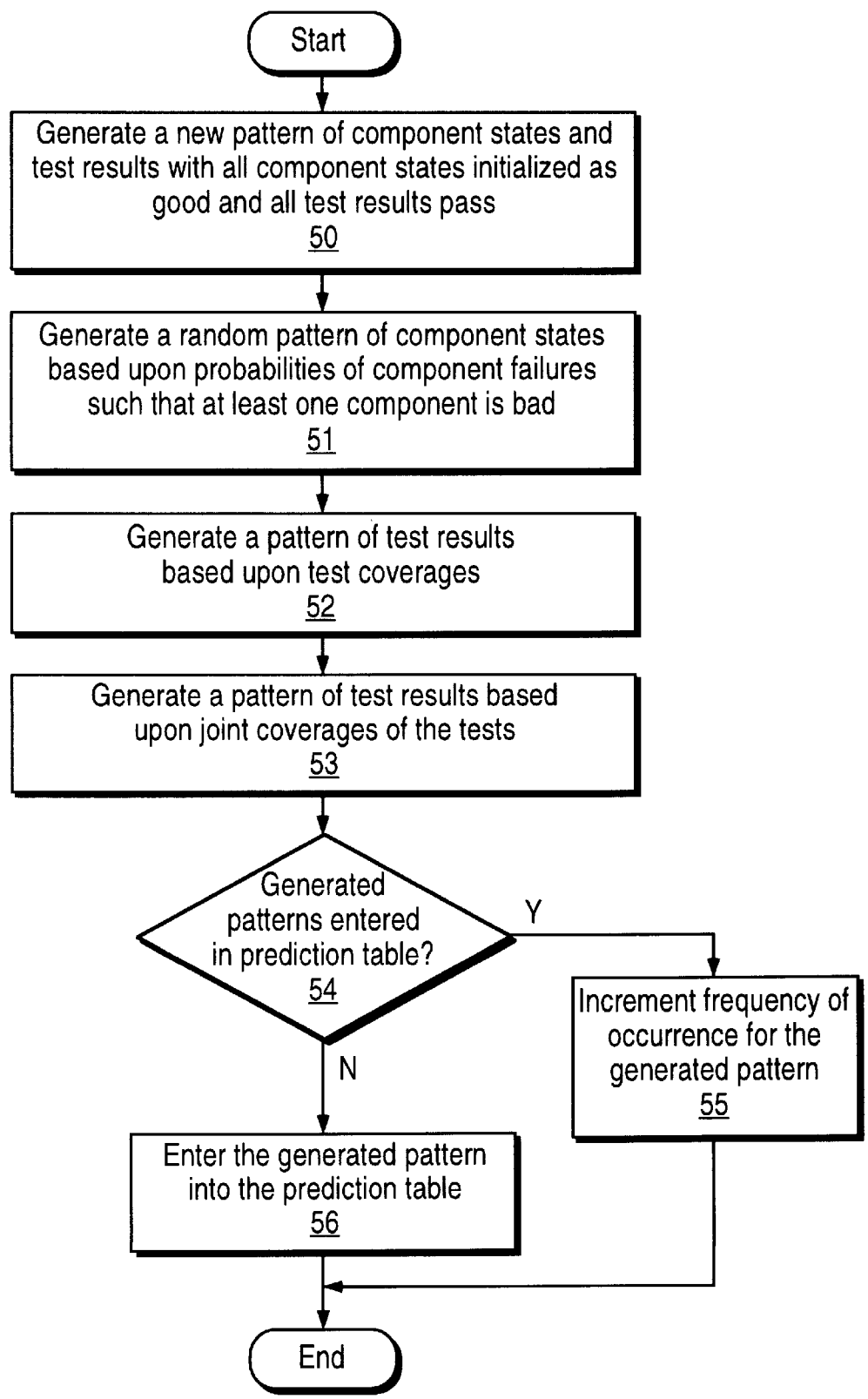
FIG. 2 illustrates a procedure for generating a set of statistical simulation data for the prediction table.

FIG. 2 illustrates the simulation performed by the statistical simulator 32. The simulation is set forth as steps 50 through 56, inclusive, which are repeatedly performed for a large predetermined number of times (T).

The statistical simulator 32 need only be run one time for a given model of the device under test 10, the components 1–n, and the tests 1–m. Thus, the work of diagnosis is divided into a preprocessing part which is done once only, and efficient decision procedures 20 and 22 that are performed for each device under test.

At step 50, a new pattern of component states is generated in which each state is initialized to "GOOD" and a new pattern of test results is generated in which each result is initialized to "PASS".

The pattern of component states generated at step 50 is modified by setting the component state for each component i to "BAD" with probability p(i). The a priori probability p(i) in one embodiment is a n engineering estimate of the probability of failure of the component i. In another embodiment, the probabilities p(1)–p(n) provide a relative indication of the probabilities of failure among components 1–n.

It is assumed that no diagnosis will be performed unless at least one test has failed. It is also assumed that a test will fail only if at least one component is bad. Consequently, there is no reason to put an entry into the prediction table 30 unless its pattern of component states contains at least one "BAD".

Therefore, a random patterns of component states is generated at step 51 such that the random pattern of component states contains at least one "BAD" indication. In one embodiment, the state of each component i in the list of components is set to "BAD" with probability p(i). The resulting pattern of component states is then checked to determine whether it contains at least one "BAD." If the resulting pattern of component states does not contain at least one "BAD" then it is discarded and another pattern is generated. This process is repeated until a sufficient number of patterns of component states each containing at least one "BAD" has been generated. Since the probability p(i) that the state of a given component will be BAD is generally much closer to zero than to one, the process just described will typically generate many all-GOOD patterns of component states for each pattern of component states containing at least one "BAD." Consequently, the process just described does not make efficient use of available computer power or time.

Figure 3:
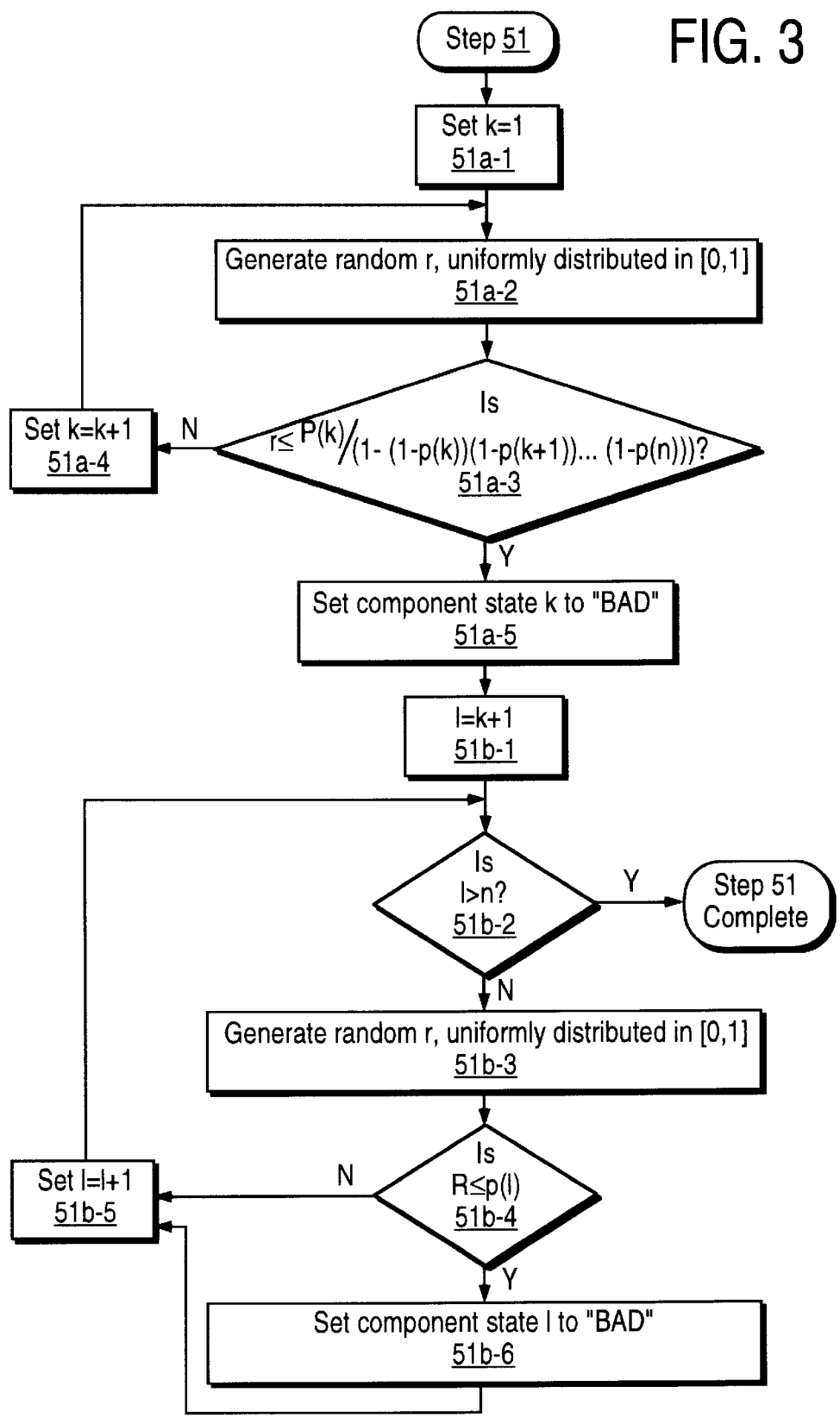
FIG. 3 illustrates a process for generating patterns of component states that requires only a single pass through the list of components to generate a pattern of component states that contains at least one "BAD;"

FIG. 3 illustrates a process for generating patterns of component states that requires only a single pass through the list of components to generate a pattern of component states that contains at least one "BAD." The process operates in two phases which are shown as steps 51a–1 through 51a–5 and steps 51b–1 through 51b–6, respectively. The first phase steps through the list of components and assigns the state "BAD" to each component with an enhanced probability. The enhanced probability is computed both to guarantee that at least one BAD component state is generated in each pass through the list of components, and to guarantee that the overall probability of assigning the state "BAD" to component i remains p(i). The first phase ends once the state "BAD" has been assigned to one component, and the second phase begins. The second phase steps through the remainder of the component list, and assigns the state "BAD" to the component i with the original, un-enhanced probability p(i).

Step 51a–1 through 51a–5: For k=1 to n; generate a uniformly-distributed random number r between 0 and 1. If $r \leq p(k)/(1-(1-p(k))*(1-p(k+1))* \ldots *(1-p(n)))$, then set the state of component k to "BAD," and go to step 51b–1.

Step 51b–1 through 51b–6: For l=k+1 to n; generate a uniformly distributed random number r between 0 and 1. If $r \leq p(1)$, then set the state of component l to "BAD."

Note that the value of $p(k)/(1-(1-p(k))*(1-p(k+1))* \ldots *(1-p(n)))$ for each possible value of k between 1 and n can be computed once for a particular device under test and can then be stored for rapid access when needed in step 51a.

At step 52, a pattern of test results is generated based upon test coverages. Assume an unsigned integer variable may contain values from 0 to $2^N-1$, inclusive, for some machine-dependent integer N. Step 52 is performed according to the following steps for each component j to which state "BAD" was assigned in step 51, for each test i:

Generate a uniformly distributed random number r in the range $2^N-1$.

If $(r+floor(cov(i,j)*(2^N-1)))$ mod $2^N < r$, where floor(x) is the greatest integer less than or equal to x, then set test result of test i to FAIL. (Note that the values $floor(cov(i,j)*(2^N-1))$ can be computed once, after the inputs are read but before the simulations are begun. Note that the modulo $2^N$ operation is the usual result of overflow in binary addition, and so it never needs to be computed).

At step 53, a pattern of test results based upon the joint coverages of the tests 1–m is generated. Step 53 is performed according to the following steps for each joint coverage i, for each component j to which the state "BAD" was assigned in step 51:

Generate a uniformly distributed random unsigned integer r in the range 0 to $2^n-1$ inclusive.

If $(r+floor(jcv(i,j)*(2^n-1)))$ mod $2^n < r$ then for each test k that uses joint coverage i, set the test result of test k to FAIL.

At step 54, it is determined whether there is an entry in the prediction table 30 for the pattern of test results and the pattern of component states generated in steps 50 through 53.

If there is such an entry, then the frequency-of-occurrence field for that entry in the prediction table 30 is incremented by 1 at step 55. If there is no such entry, then the entry is created and added to the prediction table 30 with the frequency-of-occurrence initialized to 1 at step 56.

FIG. 4 illustrates the procedure 22 for selecting one or more best next tests to perform on the device under test 10. The best next tests are the ones of the tests 1–m that will result in the least number of tests being performed before the procedure 20 generates a reliable answer for which of the components 1–n is most likely bad. The procedure 22 takes as inputs the prediction table 30 and the current test results indicated in the test result table 16.

The procedure 22 generates the next test table 26 which contains one row for each of the tests 1–m that has not yet been performed on the device under test 10. The next test table 26 contains two columns. The first column contains identifiers such as test numbers of the tests not yet performed. The second column contains the expected proportion of correct diagnoses that will result if the test in the first column is performed next and the result along with all previous test results on the device under test 10 is run through the procedure 20.

Table 2 illustrates an example of the next test table 26 which can provide to a skilled technician a display of several next tests, the best next test along with several other good next tests.

TABLE 2

| Test: | Score: |
|---|---|
| T6 | 0.3 |
| T1 | 0.25 |
| T12 | 0.05 |

The values in the second column of the next test table 26, under "Score" in Table 2, are the values L which are computed as set forth below. The values in L are sorted and the values are displayed, in one embodiment, in decreasing order beside the identifying names of the associated tests.

Each value in the second column of the next test table 26 is a measure of the "goodness" of a next test. The best test may then be selected as the one whose performance leads to the highest probability of a correct diagnosis, i.e. the highest value in the second column. The values in the second column may be combined with corresponding indications of the economic costs associated with performing the tests 1–m which are contained in the table 28. The economic cost of a particular test may reflect, for example, the economic cost of downtime of the device under test 10 or other related devices which is incurred during application of the particular test. Any tests 1–m having equal or approximately equal values in the second column of the next test table 24 may be selected by the procedure 22 on the basis of which test has a lower economic cost as indicated by the contents of the table 28.

In some embodiments, graphical symbols, color codes, etc., may be used instead of numbers to represent the relative likelihood of th e diagnoses and the relative goodness of the next tests.

The next test table 26 can be sorted by either column. In one embodiment, the next test table 26 is sorted by the second column, so that the best test appears in the first row. The Best Next Test is the test that has the highest value in the second column, because the choice of that test maximizes the improvement in the rate of successful diagnosis.

Initially, an empty next test table 26 is created. Steps 72 through 76 are then performed for each test j that has not yet been performed as indicated by the current test results contained in the test result table 16.

At step 72, $P(T_j=FAIL)$ is determined which is the probability that test j will fail given the current test results. $P(T_j=FAIL)$ is determined according to the following steps:

Generate u which is a sum of the frequency-of-occurrence fields of all the entries of the prediction table 30 having test results that match the current test results indicated in the test result table 16.

Generate w which is a sum of the frequency-of-occurrence fields all of the entries of the prediction table 30 having test results that match the current test results and that have test j indicating FAIL.

Generate $P(T_j=FAIL)=w/u$.

At step 73, $P(T_j=PASS)$ is determined which is the probability that test j will pass given the input previous test results. $P(T_j=PASS)$ is given by the following equation:

$$P(T_j=PASS)=1-P(T_j=FAIL)$$

At step 74, L_FAIL is determined which is the proportion of diagnoses that will be correct if test j is applied next on the device under test 10 and fails. Step 74 is performed according to the following steps:

Set L_FAIL to 0.

Set the test result table 16 to indicate that test j is completed and failed.

For each component i, generate $Pi=v(\Delta\_i)/v(\Delta)$ and add max(Pi, 1−Pi) to L_FAIL; where $v(\Delta)$ is the sum of the frequency-of-occurrence fields of all the entries in the prediction table 30 that match the pattern of passed and failed tests listed in the test result table 16 and where $v(\Delta\_i)$ which is the sum of the frequency-of-occurrence fields of the entries of the prediction table 30 that match the pattern of passed and failed tests listed in the test result table 16 and that indicate component i is BAD.

Generate L_FAIL=L_FAIL/n, where n is the number of components 1–n.

Remove test j from the list of completed tests in the test result table 16.

At step 75, L_PASS is determined which is the proportion of diagnoses that will be correct of test j is run next on the device under test 10 and passes. Step 75 is performed according to the following steps:

Set L_PASS to 0.

Set test j in the test result table 16 to indicate completed and passed.

For each component i, generate $Pi=v(\Delta\_i)/v(\Delta)$ and add max(Pi, 1−Pi) to L_PASS; where $v(\Delta)$ is the sum of the frequency-of-occurrence fields of all the entries in the prediction table 30 having the pattern of test results contained in the test result table 16 and where $v(\Delta\_i)$ is the sum of the frequency-of-occurrence fields of the entries of the prediction table 30 that match the pattern in the test result table 16 and that indicate component i is BAD.

Generate L_PASS=L_PASS/n, where n is the number of components 1–n.

Remove test j from the list of completed tests in the test result table 16.

At step 76, $L_j$ which is the expected proportion of correct diagnoses if test j is performed next on the device under test 10 is determined according to the is following equation.

$$L_j=P(T_j=FAIL)*L\_FAIL+P(T_j=PASS)*L\_PASS$$

Thereafter j and $L_j$ are written to the next test table 26 as the entries for the first and second columns, respectively, of the next available row of the next test table 26.

Finally, if the next test table 26 is to be sorted by either output column, then the sorting step is performed. The highest expected proportion of correct diagnoses listed in the next test table 26 may be selected as the best next test or the expected proportions listed in the next test table 26 may be weighted by the economic costs associated with performing the tests.

FIG. 5 illustrates one embodiment of the procedure 20 which enables a user to determine the most likely bad component of the device under test 10. The procedure 20 generates the list 24 of one or more most likely bad components from among the components 1–n. The procedure 20 takes as inputs the prediction table 30 and a current state of the test result table 16 which indicates which of the tests 1–m have been applied to device under test 10 and whether the applied tests passed or failed. The procedure 20 generates the list 24 of bad components to minimize the average number of wrongly diagnosed components over a large number of devices under test.

At step 60, $v(\Delta)$ is generated which is the sum of the frequency-of-occurrence fields of all the entries in the prediction table 30 having the pattern of passed and failed tests provided by the current state of the test result table 16 (the current test results).

Steps 62–68 are performed for each component i wherein i ranges from 1 to n, the number of components of the device under test 10.

At step 62, $v(\Delta\_i)$ is generated which is the sum of the frequency-of-occurrence fields of the entries of the prediction table 30 that match the current test results and that indicate component i is BAD.

If $2*v(\Delta\_i)>v(\Delta)$ at step 64 then the list 24 is written to indicate that component i is GOOD at step 66. Otherwise, the list 24 is written to indicate that component i is BAD at step 68.

At the end of the procedure 20, the list 24 contains a GOOD or a BAD indication for each of the components 1–n wherein each BAD indication identifies the corresponding component as a likely bad component. The combination of the indications of likely bad components in the list 24 and the economic cost associated with replacing the likely bad components in the table 28 provides information that enables selection of which likely bad component to replace. For example, if the list 24 contains two or more likely bad components then the user or the procedure 20 itself selects the likely bad component in the list 24 having the lowest economic cost for replacement as indicated in the list 28.

In some embodiments of a model-based diagnostic system it is desirable to present a skilled technician with a list of several most likely bad components. Table 3 illustrates such a presentation of several most likely bad components.

TABLE 3

| Components: | Probability: |
|---|---|
| U1 | 0.5 |
| U2 and U7 | 0.4 |
| U3 | 0.1 |

Table 3 can be interpreted as "the probability of only U1 being bad is 0.5, the probability that U2 and U7 are *both* bad is 0.4, and the probability that only U3 is bad is 0.1."

FIG. 6 illustrates an alternative embodiment of the procedure 20 which determines the probabilities of failure of the sets of components which are presented in the list 24 in the format shown in Table 3. At step 100, the rows of the prediction table 30 whose patterns of test results match the current test results in the test result table 16 are extracted and a sum N is generated which is the sum of the frequency-of-occurrence fields of the rows extracted.

An empty list of most likely bad components 24 is initially created. The elements of the list 24 include a pair of fields. The first field is a pattern of BAD components. The second field is a number-of-times that the corresponding pattern occurs in the rows extracted at step 100.

Steps 110 and 120 are performed for each particular row of the prediction table 30 extracted at step 100 that matches the current test results in the test result table 16.

At step 110, if the pattern of BAD components for the particular extracted row appears in the list 24, then the frequency-of-occurrence field of the particular extracted row is added to the number-of-times for that pattern in the list 24.

At step 120, if the pattern of BAD components for the particular extracted row does not appear in the list 24, then a new element is added to the list 24. The pattern of BAD components field of the new element in the list 24 is set to the pattern of the particular extracted row of the prediction table 30. In addition, the number-of-times field if the new element in the list 24 is set to the frequency-of-occurrence field of the particular extracted row of the prediction table 30.

The list 24 is sorted by the number-of-times fields. Step 130 is performed for each particular row in the list 24. At step 130, the number-of-times for the particular row is replaced with the number-of-times divided by N.

After step 130, the list 24 contains patterns of BAD components along with their probability given the test results. Graphical symbols, color codes, etc., may be used instead of numbers to represent the relative probabilities of bad components.

The diagnostic techniques described herein are conducted so as to maximize a known objective function, namely the proportion of good diagnoses over a large number of devices under test. As a consequence, the results of the diagnosis are easier to interpret and verify experimentally than heuristics-based diagnosis. This in turn makes it easier to debug the component/test model that is input to the statistical simulator 32.

The procedure 22 chooses one or more best next tests to maximize the expected improvement in the rate of successful diagnosis. Again, this metric is easy to interpret and verify.

If information about the cost of tests and the cost of incorrect diagnoses are available, the procedure 20 and 22 are readily modified so that the most-likely bad diagnosis and best next test selection are chosen to minimize the expected cost of testing and of incorrect diagnosis.

The procedures 20 and 22 are well-suited to be embedded in the device tester 12 or downloadable applications for the device tester 12. The procedures 20 and 22 are compact and perform neither the exhaustive searches required by prior artificial intelligence techniques nor the extensive floating point computations required by prior statistical techniques.

The prediction table 30 need not be stored exactly as depicted in Table 1. There are various tree storage, indexing, hashing, and data compression techniques that may reduce the amount of memory required to store the prediction table 30 and/or speed access to the values stored in the prediction table 30. These techniques and the criteria for choosing among them based on their relative advantages in particular situations are well known to those skilled in the art of design of computer algorithms, data structures, and programs.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A diagnostic system that enables selection of one or more components in the device under test for replacement and a selection of one or more next tests from among a set of diagnostic tests not yet applied to a device under test in response to a test result for each of a subset of the diagnostic tests that have been applied to the device under test wherein each diagnostic test covers a portion of one or more of the components, and in response to a set of patterns of test results and good/bad states of the components and a frequency of occurrence indication for each pattern.

2. The diagnostic system of claim 1, wherein the next tests are provided to a user in a table that includes an identifier of each next test and a goodness indication for each next test.

3. The diagnostic system of claim 2, wherein the table is sorted in response to the goodness indications.

4. The diagnostic system of claim 2, wherein the goodness indication is a numerical value that indicates the relative goodness among the next tests.

5. A diagnostic system that enables a selection of one or more next tests from among a set of diagnostic tests not yet applied to a device under test in response to a test result for each of a subset of the diagnostic tests that have been applied to the device under test wherein each diagnostic test covers a portion of one or more of the components, and in response to a set of patterns of test results and good/bad states of the components and a frequency of occurrence indication for each pattern wherein the next tests are provided to a user in a table that includes an identifier of each next test and a goodness indication for each next test and wherein the goodness indication is a graphical display element that indicates the relative goodness among the next tests.

6. The diagnostic system of claim 2, wherein each goodness indication includes an economic cost associated with performing the corresponding next test.

7. The diagnostic system of claim 1, wherein data indicating the next tests are transmitted to an element that operates in response thereto, the data including an identifier of each next test and a goodness indication for each next test.

8. A diagnostic system that enables a selection of one or more next tests from among a set of diagnostic tests not yet applied to a device under test in response to a test result for each of a subset of the diagnostic tests that have been applied to the device under test wherein each diagnostic test covers a portion of one or more of the components, and in response to a set of patterns of test results and good/bad states of the components and a frequency of occurrence indication for each pattern wherein for each diagnostic test not yet applied the selection of the next test includes the steps of:

determining a first probability that the diagnostic test not yet applied will fail given the test results;

determining a second probability that the diagnostic test not yet applied will pass given the test results;

determining a first proportion of diagnoses that will be correct if the diagnostic test not yet applied is applied next and fails;

determining a second proportion of diagnoses that will be correct if the diagnostic test not yet applied is applied next and passes;

determining an expected proportion of correct diagnoses if the diagnostic test not yet applied is applied next given the first and second probabilities and the first and second proportions.

9. The diagnostic system of claim 8, wherein the selection of the next test further includes the step of selecting the next test from among the diagnostic tests not yet applied to the device under test given the expected proportions and a set of costs associated with applying the diagnostic tests not yet applied to the device under test.

10. A diagnostic system that enables a selection of one or more next tests from among a set of diagnostic tests not yet applied to a device under test in response to a test result for each of a subset of the diagnostic tests that have been applied to the device under test wherein each diagnostic test covers a portion of one or more of the components, and in response to a set of patterns of test results and good/bad states of the components and a frequency of occurrence indication for each pattern and wherein the patterns of test results and good/bad states of the components and the frequency of occurrence indication for each pattern are generated by a statistical simulation of the test results and probable good/bad states in response to a probability of failure of each component and a set of test coverage information for the diagnostic tests.

11. The diagnostic system of claim 10, wherein the probability of failure of each component is based upon an a priori engineering estimate.

12. The diagnostic system of claim 10, wherein the test coverage information includes a test coverage indication for each of the diagnostic tests such that each test coverage indication specifies the portions of the components that are tested by the corresponding diagnostic test.

13. The diagnostic system of claim 10, wherein the test coverage information includes a set of joint coverage indications each of which specify a known dependency among the diagnostic tests wherein each known dependancy occurs when two or more of the diagnostic tests covers a portion of one or more of the components in the same way.

14. The diagnostic system of claim 1, wherein the patterns of test results and good/bad states of the components and the frequency of occurrence indication for each pattern represent actual test results and good/bad states obtained from historical data.

15. A diagnostic system that enables a determination of one or more most-likely bad components from among a set of components in a device under test in response to a test result for each of a set diagnostic tests that have been applied to the device under test wherein each diagnostic test covers a portion of one or more of the components, and in response to a set of patterns of test results and good/bad states of the components and a frequency of occurrence indication for each pattern, and in response to an indication of economic costs associated with replacing each component.

16. The diagnostic system of claim 15, wherein the determination of one or more most-likely bad components includes:

generating a first sum of the frequency of occurrence indications that correspond to the test results;

for each of the components, generating a second sum of the frequency of occurrence indications that correspond to the test results and that indicate that the component is BAD, and writing a list of most likely bad components to indicate that the component is GOOD if the second sum is greater than the first sum and otherwise writing the list of most likely bad components to indicate that the component is BAD.

17. The diagnostic system of claim 16, wherein the determination of one or more most-likely bad components further includes selecting a component for replacement from among the components indicated as BAD in the list of most likely bad components in response to the indication of economic costs associated with replacing each component.

18. The diagnostic system of claim 17, wherein a user performs selecting a component for replacement from among the components indicated as BAD in the list of most likely bad components in response to the indication of economic costs associated with replacing each component.

19. The diagnostic system of claim 15, wherein the patterns of test results and good/bad states of the components and the frequency of occurrence indication for each pattern are generated by a statistical simulation of the test results and probable good/bad states in response to a probability of failure of each component and a set of test coverage information for the diagnostic tests.

20. The diagnostic system of claim 19, wherein the probability of failure of each component is based upon an a priori engineering estimate.

21. The diagnostic system of claim 19, wherein the test coverage information includes a test coverage indication for each of the diagnostic tests such that each test coverage indication specifies the portions of the components that are tested by the corresponding diagnostic test.

22. The diagnostic system of claim 19, wherein the test coverage information includes a set of joint coverage indications each of which specify a known dependency among the diagnostic tests wherein each known dependancy occurs when two or more of the diagnostic tests covers a portion of one or more of the components in the same way.

23. The diagnostic system of claim 15, wherein the patterns of test results and good/bad states of the components and the frequency of occurrence indication for each pattern represent actual test results and good/bad states obtained from historical data.

24. The diagnostic system of claim 15, wherein the determination of one or more most-likely bad components includes:

generating a sum N of the frequency of occurrence indications of the patterns that match the test results;

for each pattern that matches the test results, if the pattern exists in a list of most likely bad components, then adding the frequency of occurrence indication of the pattern to a number of times indication for the pattern in the list of most likely bad components, and otherwise adding the pattern to the list of most likely bad components and writing the frequency of occurrence indication of the pattern to a number of times indication for the pattern in the list of most likely bad components;

for each pattern in the list of most likely bad components, replacing the number of times indication with the number of times indication divided by N.

25. The diagnostic system of claim 24, further comprising sorting the list of most likely bad components by the number of times indications.

* * * * *